United States Patent
Chung et al.

(10) Patent No.: US 8,680,870 B2
(45) Date of Patent: Mar. 25, 2014

(54) ENERGY-RECYCLING BURN-IN APPARATUS FOR ELECTRONIC BALLASTS AND A METHOD OF BURNING-IN ELECTRONIC BALLASTS

(75) Inventors: Shu Hung Henry Chung, Hong Kong (HK); Nan Chen, Hong Kong (HK)

(73) Assignee: City University of Hong Kong, Kowloon (HK)

(*) Notice: Subject to any disclaimer, the term of this patent is extended or adjusted under 35 U.S.C. 154(b) by 182 days.

(21) Appl. No.: 13/150,452

(22) Filed: Jun. 1, 2011

(65) Prior Publication Data

US 2012/0306408 A1    Dec. 6, 2012

(51) Int. Cl.
*G01R 31/08* (2006.01)
*G05F 1/00* (2006.01)

(52) U.S. Cl.
USPC ........... 324/522; 324/525; 324/555; 315/307; 315/287

(58) Field of Classification Search
USPC ......... 324/119, 120, 134, 415, 416, 555, 525, 324/522; 363/15, 34, 37, 44; 315/307, 287, 315/224, 119, 246, 149, 309
See application file for complete search history.

(56) References Cited

U.S. PATENT DOCUMENTS

| 6,614,231 B2* | 9/2003 | Thrap | 324/416 |
| 7,804,193 B2* | 9/2010 | Yan et al. | 307/45 |
| 2008/0238196 A1* | 10/2008 | Yan et al. | 307/20 |
| 2008/0309361 A1* | 12/2008 | Kita et al. | 324/760 |

* cited by examiner

*Primary Examiner* — Vibol Tan (57) ABSTRACT

An apparatus and method for burning-in an electronic ballast for a lamp. The apparatus comprises a first stage for emulating an input impedance characteristic of a lamp for the electronic ballast and a second stage connected to the first stage for providing energy feedback to a power supply. An input of the first stage connects in use to the electronic ballast to be burnt-in. An output of the second stage connects in use to the power supply to provide energy feedback to said power supply from the electronic ballast being burnt-in. The energy-recyclable burn-in apparatus can emulate the lamp characteristics from start up to the steady state, process high-frequency ballast output power and recycle the power back into the power grid. The burn-in method includes operating the apparatus for a predetermined period of time such that a voltage applied to the electronic ballast simulates a steady-state operation of a lamp for the electronic ballast.

5 Claims, 7 Drawing Sheets

ENERGY-RECYCLING BURN-IN APPARATUS FOR ELECTRONIC BALLASTS AND A METHOD OF BURNING-IN ELECTRONIC BALLASTS

FIELD OF THE INVENTION

The invention relates to a burn-in apparatus for electronic ballasts and a method of burning-in electronic ballasts. The invention relates particularly, but not exclusively to a burn-in apparatus having an energy recycling capability.

BACKGROUND OF THE INVENTION

Manufacturing energy efficient electronic products to be "eco-friendly" or "environmentally friendly" is becoming increasingly popular, even necessary, as a means to assist protection of the environment, promote products, and meet ever more stringent regulatory requirements in different countries. However, saving energy need not only encompass improving the energy efficiency of a product when it is being used, but may also encompass the energy consumed in the production and testing of the product.

For many electronic products, after assembly, the product is subjected to a burn-in process intended to weed out infant mortalities thereby improving the reliability of products delivered to consumers. The use of energy-recycling in the burn-in process is known in the power supply manufacturing industry, but the development of energy-recyclable burn-in systems for electronic ballasts has not, to date, been particularly successful because of the technical challenges peculiar to the electronic ballast burn-in process. The most common existing burn-in method for electronic ballasts is carried out by connecting a lamp or a resistor at the ballast's output and operating the ballast at steady-state for a predetermined period of time. However, this has associated with it a number of disadvantages. Not only does this burn-in method waste electrical power, it also raises ambient temperatures in the test facility, requiring enhanced ventilation systems to remove excessive heat. Significantly, this well known burn-in method for electronic ballasts expends all energy used in the burn-in process as heat and light and is thus very wasteful.

OBJECTS OF THE INVENTION

An object of the invention is to mitigate or obviate to some degree one or more problems associated with known burn-in apparatuses and methods for electronic ballasts.

The above object is met by the combination of features of the main claim; the sub-claims disclose further advantageous embodiments of the invention.

One skilled in the art will derive from the following description other objects of the invention. Therefore, the foregoing statement of object is not exhaustive and serves merely to illustrate some of the many objects of the present invention.

SUMMARY OF THE INVENTION

In a first main aspect of the invention, there is provided an apparatus for burning-in an electronic ballast, comprising: a first stage for emulating an input impedance characteristic of a lamp for the electronic ballast; a second stage connected to the first stage for providing energy feedback to a power supply; an input of the first stage for connecting to the electronic ballast to be burnt-in; and an output of the second stage for connecting to the power supply to provide energy feedback to said power supply from the electronic ballast being burnt-in.

Advantageously, a part of the energy supplied for the burn-in process can be recycled back to the power grid thereby saving energy and reducing the size of ventilation and cooling systems at the burn-in test facility.

A further advantage is that the burn-in apparatus of the invention requires fewer power conversion stages than known recyclable energy burn-in apparatuses for power supplies.

Preferably, the first stage comprises a high frequency ac/dc converter to emulate the input impedance characteristic of the lamp for the electronic ballast. The high frequency ac/dc converter may be operable to convert a high frequency ac power signal from the electronic ballast to a dc power signal. The input of the high frequency ac/dc converter is connectable to an output of the electronic ballast to be burnt-in by a circuit comprising an inductor and an LC filter. The LC filter may be adapted to be operated at a resonant frequency equal to or near to the operating frequency of the electronic ballast to be burnt-in. An output of the high frequency dc/dc converter may comprise a bank of capacitors.

Preferably, gate signals for first and second transistors of the high frequency ac/dc converter are switched at the same or nearly at the same frequency as the operating frequency of the electronic ballast to be burnt-in.

Preferably also, the second stage comprises a voltage source inverter for providing energy feedback to said power supply from the electronic ballast being burnt-in. The voltage source inverter may be operated at a unit power factor or at a higher than unit power factor. The voltage source inverter may comprise a half-bridge circuit and a low pass filter, wherein the output current of the half-bridge circuit is controlled to follow a reference current in phase with the voltage of the power supply.

An output of the first stage may be connected to an input of the second stage by a dc link.

In a second main aspect of the invention, there is provided a method of burning-in an electronic ballast using an apparatus comprising: a first stage for emulating an input impedance characteristic of a lamp for the electronic ballast; a second stage connected to the first stage for providing energy feedback to a power supply; an input of the first stage for connecting to the electronic ballast to be burnt-in; and an output of the second stage for connecting to the power supply to provide energy feedback to said power supply from the electronic ballast being burnt-in; the method comprising the steps of: connecting the input of the first stage to the electronic ballast to be burnt-in; connecting the output of the second stage to the power supply; and operating the apparatus for a predetermined period of time such that a voltage applied to the electronic ballast simulates a steady-state operation of a lamp for the electronic ballast.

Preferably, the method comprises, prior to operating the apparatus to emulate a steady-state operation of a lamp for the electronic ballast, the step of emulating a breakdown phase of the lamp for the electronic ballast whereby a relay and comparator circuit is connected at the input of the first stage and the apparatus is controlled to: continuously monitor the output voltage of the ballast; at the comparator, compare the output voltage of the ballast with a predetermined breakdown voltage; and trigger the relay when the output voltage of the ballast exceeds the breakdown voltage.

Preferably also, the method comprises, after operating the apparatus to emulate a breakdown phase, the step of emulating a thermionic low pressure arc phase of the lamp for the electronic ballast whereby the apparatus is controlled to: modify a level of a reference voltage over time until the voltage of the electronic ballast being burnt-in is determined as being at a level for emulating the steady-state operation of said lamp for the electronic ballast.

The summary of the invention does not necessarily disclose all the features essential for defining the invention; the invention may reside in a sub-combination of the disclosed features.

BRIEF DESCRIPTION OF THE DRAWINGS

The foregoing and further features of the present invention will be apparent from the following description of preferred embodiments which are provided by way of example only in connection with the accompanying figures, of which:

FIG. 2b is a phasor diagram showing the relationships among $v_{Lamp}$, $v_o$, $v_{Cr}$, $v_L$, and $i_L$ for the equivalent circuit of FIG. 2a;

DESCRIPTION OF PREFERRED EMBODIMENTS

The following description is of a preferred embodiment by way of example only and without limitation to the combination of features necessary for carrying the invention into effect.

The failure rate of a population of products versus operation time is often depicted by a bathtub curve. The curve describes a particular form of the hazard function, also known as the force of mortality function or the failure rate function. The curve represents three periods, including an early failures period with a decreasing product failure rate, a normal life period with a low, relatively constant failure rate, and a wear-out period with an increasing failure rate.

Many electronic products such as lamps and the like generally undergo a burn-in process to improve their reliability by weeding out early failures, i.e. those products that fall within the early failures period of the hazard function curve. During burn-in, the products are operated under electrical and thermal conditions that approximate the real life of the components or systems, but within a much compressed operating time. The main purpose of the burn-in process is to weed out components or systems with early failures before delivery of products to customers, although other diagnostic tests can be performed to improve the product design, for example. The duration of the burn-in process may range from a few hours to days, depending on the product requirements and specifications. Consequently, the burn-in process can consume considerable amounts of electrical power.

To reduce energy consumption, the concept of energy recycling in the burn-in process has been used in the power supply manufacturing industry. A typical structure of an energy recycling burn-in device for a dc power supply has three power conversion stages including a first stage for controlling the current and thus the power drawn from the power supply under test. However, such a configuration inherently confines its application to burning-in of power supplies with dc or low-frequency, e.g. 50/60 Hz, ac power outputs under fairly constant loading conditions. As such, this configuration is not technically applicable for performing a burn-in process for electronic ballasts that deliver high-frequency power to discharge lamps such as fluorescent (FL) and high-intensity discharge (HID) lamps.

The existing burn-in method for electronic ballasts includes connecting a lamp or a resistor at a ballast's output. However, as this method expends all of the energy as heat and light, it would be useful if a means could be provided for recycling at least some of the energy supplied to the electronic ballast during the burn-in process such that power output from the ballast can be recycled back to the ac power grid or power supply.

Figure 1:
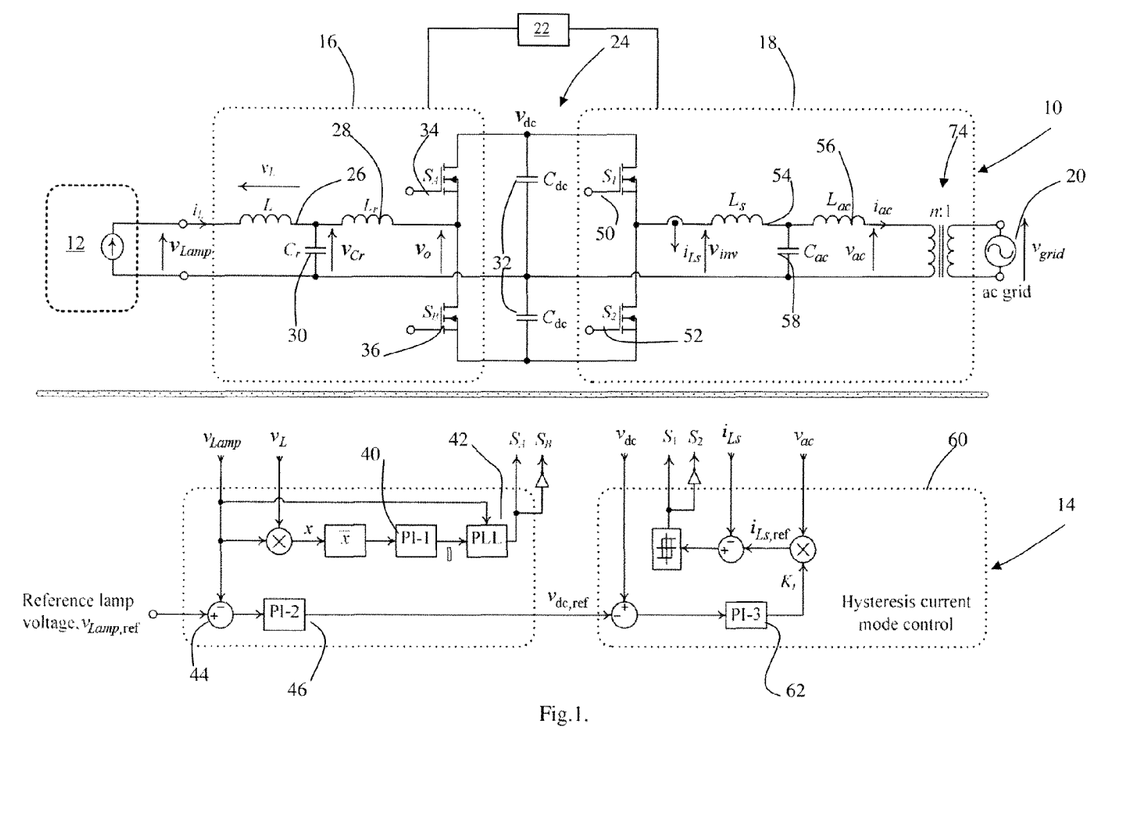
FIG. 1 is a schematic circuit diagram including a block diagram of the control method for an energy-recyclable burn-in apparatus for electronic ballasts according to the invention.

The invention provides an energy-recyclable burn-in apparatus 10 for testing high-frequency electronic ballasts 12 as illustrated in FIG. 1. Also illustrated in FIG. 1 is the block diagram 14 of the control method for the circuit of FIG. 1. The burn-in apparatus 10 comprises two stages 16, 18. A first stage 16 is provided for emulating an input impedance characteristic of a lamp which would, in use, be connected to the electronic ballast 12. A second stage 18 is connected to the first stage 16 and is provided for providing energy feedback to a power supply 20, preferably the ac power grid. An input of the first stage 16 is connected in use to an electronic ballast 12 to be burnt-in and an output of the second stage 18 is connected in use to the power supply 20 such as the mains or an auxiliary power grid to provide energy feedback to said power grid from the electronic ballast 12 being burnt-in. Consequently, a part of the energy supplied for the burn-in process can be recycled back to the power grid 20 thereby saving energy and reducing the size of ventilation and cooling systems at the burn-in test facility. Furthermore, the burn-in apparatus 10 has a minimum number of power conversion stages, having fewer power conversion stages than known recyclable energy burn-in apparatuses for power supplies. It will be understood that, whilst the apparatus 10 represented by the circuit of FIG. 1 is described as having an input connectable to a ballast 12 to be burnt-in, the apparatus 10 may be arranged such that a plurality of electronic ballasts 12 can be connected to said input for simultaneous burning-in. Furthermore, the apparatus 10 has associated with it a processing unit 22 for controlling implementation of the burn-in process according to a predetermined scheme or methodology.

The first stage 16 may use a high-frequency half-bridge ac/dc converter to emulate the required input impedance characteristics of a lamp for the ballast output and converts the high-frequency ac power from the ballast 12 to a dc link 24 which connects an out put of the first stage 16 to an input of the 18 second stage. The second stage 18 may employ a full-bridge voltage source inverter (VSI) to perform energy feedback to the grid power supply 20 with a unitary, near unitary, or higher than unitary power factor. With adjustable input impedance, the active and reactive power drawn from the ballast 12 can be controlled, and it is thus possible to simulate different testing conditions for the ballast 12 under test. This is a particularly suitable arrangement for high-power electronic ballasts 12 as it results in a considerable saving in energy over the prior art lamp/resistor methodology and consequently a short payback period for the novel burn-in apparatus of the invention.

The operations of the two stages 16, 18 of the burn-in apparatus 10 are explained in more detail below.

First Stage 16—High-Frequency ac/dc Converter.

Figure 2A:
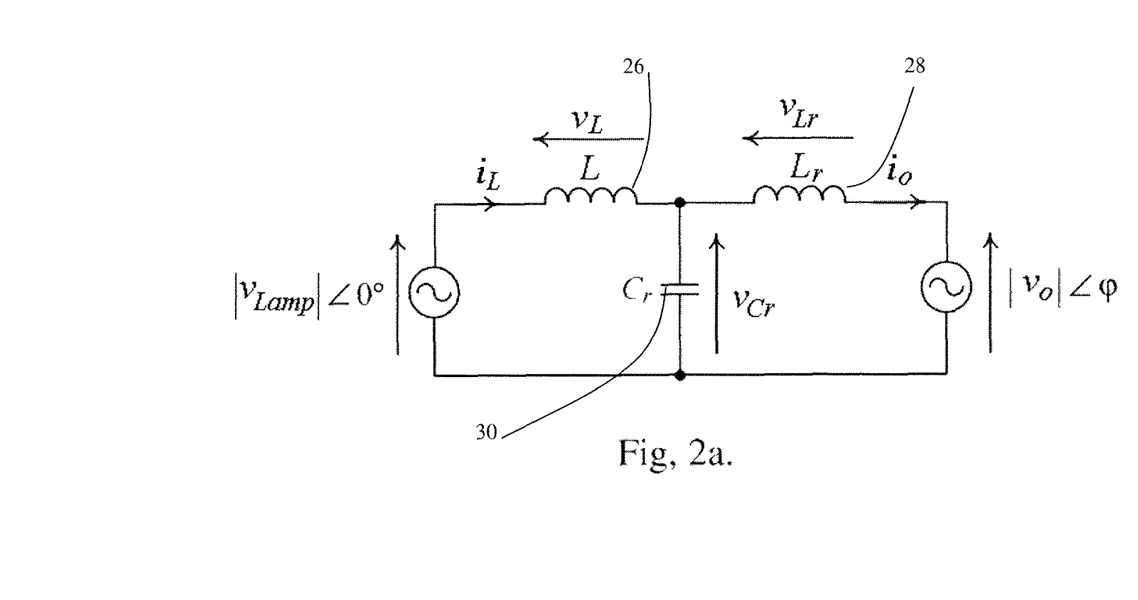
FIG. 2a is an equivalent circuit of the first stage of the burn-in apparatus of FIG. 1.

This stage 16 preferably comprises a high-frequency half-bridge ac/dc converter. Its input is connected to the output of the ballast 12 under test through an inductor L 26 and an LC filter circuit formed by an inductor $L_r$ 28 and a capacitor $C_r$ 30. The resonant frequency of the $L_rC_r$ circuit 28, 30 is designed to be at or near to the operating frequency of the ballast 12. FIG. 2(a) shows an equivalent circuit of this stage 16. The dc side of the converter is connected to the dc link 24 comprising a capacitor bank formed by two or more dc capacitors $C_{dc}$ 32 (FIG. 1). The gate signals to first and second transistors $S_A$ 34 and $S_B$ 36 of this stage are switched at preferably the same frequency as the operating frequency of the ballast 12, so that the voltage $v_o$ on the ac side of the ac/dc converter has a phase difference of $\phi$ with $v_{Lamp}$. As will be explained hereinafter, the value of $\phi$ determines the amount of power flowing from the ballast 12 to the dc capacitors $C_{dc}$ 32. The duty cycles of $S_A$ 34 and $S_B$ 36 are both preferably 0.5.

An ac analysis of the equivalent circuit in FIG. 2(a) is carried out in the following.

Let $Z_A = j\omega_s L$, $Z_B = 1/(j\omega_s C_r)$, and $Z_C = j\omega_s L_r$, where $\omega_s = 2\pi f_s$ ($f_s$ is the switching frequency of the ballast). By using KVL, $$v_{Cr} - \left(\frac{v_{Lamp} - v_{Cr}}{Z_A} - \frac{v_{Cr}}{Z_B}\right) Z_C = v_o \quad (1)$$

$$V_{Cr} = \frac{Z_{AB}}{Z_C + Z_{AB}} v_o + \frac{Z_{BC}}{Z_A + Z_{BC}} v_{Lamp}$$

where $v_{Cr}$ is the voltage across $C_r$ 30, $$Z_{AB} = \frac{Z_A Z_B}{Z_A + Z_B}, Z_{BC} = \frac{Z_B Z_C}{Z_B + Z_C},$$

$v_{Lamp}$ is the lamp voltage, and $v_o$ is the voltage on the ac side of the ac/dc converter.

The input current $i_L$ is equal to $$i_L = \frac{v_{Lamp} - v_{Cr}}{Z_A} = j(K_1 v_{Lamp} - K_2 v_0) \quad (2)$$

where $$K_1 = -\frac{1 - \omega_s^2 L_r C_r}{\omega_s L_r + \omega_s L(1 - \omega_s^2 L_r C_r)}$$

and $$K_2 = -\frac{1}{\omega_s L_r + \omega_s L(1 - \omega_s^2 L_r C_r)}.$$

The polar and rectangular forms of $v_o$ are expressed as follows $$v_o = |v_o|e^{j\varphi} \quad (3)$$

$$= |v_o|\cos\varphi + j|v_o|\sin\varphi$$

where $|v_o|$ is the magnitude of $v_o$.

The active power p and reactive power q transferring from the ballast to the converter are calculated by substituting (3) into (2). Thus, $$p = \text{Re}[v_{Lamp} i_L *] \quad (4)$$

$$= K_2 |v_{Lamp}||v_o|\sin\varphi$$

and $$q = \text{Im}[v_{Lamp} i_L *] \quad (5)$$

$$= -K_1 |v_{Lamp}|^2 + K_2 |v_{Lamp}||v_o|\cos\varphi$$

where Re[•] and Im[•] are the real and imaginary parts of the function, respectively, and $i_L*$ is the conjugate of $i_L$.

Thus, the input of the converter can be controlled to be resistive by making q=0 in order to simulate the resistive characteristics of the discharge lamps operating at high frequency. Thus, based on (4), the equivalent input resistance $R_{eq}$ of the ac/dc converter is $$R_{eq} = \frac{|v_{Lamp}|^2}{p} \quad (6)$$

$$= \frac{|v_{Lamp}|}{K_2 |v_o|\sin\varphi}$$

Figure 2B:
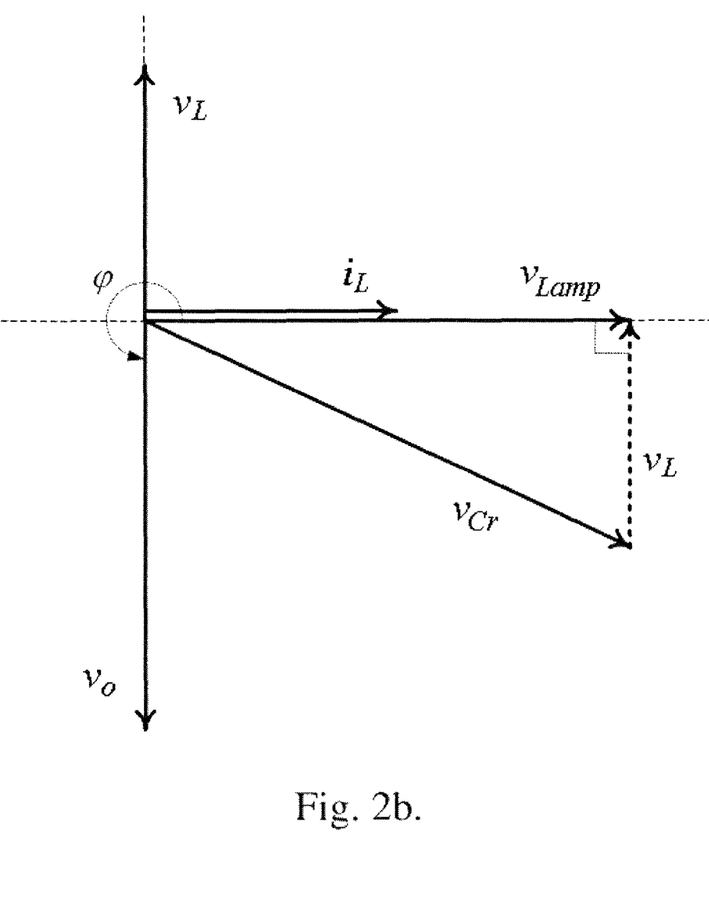

Therefore, the power drawn from the ballast 12 to the dc link 24 is determined by the value of $\phi$ and magnitude of $v_o$ (or $v_{dc}$). FIG. 2(b) shows the phasor relationships among $v_{Lamp}$, $v_o$, $v_{Cr}$, voltage across the inductor L ($v_L$), and current through the inductor L ($i_L$).

To realize the high-frequency resistive characteristics of a discharge lamp, it is necessary to meet the following two requirements:

R1: $i_L$ is in phase with $v_{Lamp}$ and

R2: $v_{Lamp}$ is regulated at a reference lamp voltage $v_{Lamp,ref}$, to emulate the operating condition of a lamp.

FIG. 1 also shows the block diagram of the control method for the circuit of the burn-in apparatus 10 according to the invention. An indirect method is used to meet the requirement R1. As shown in the phasor diagram of FIG. 2(b), $i_L$ lags $v_L$ by 90° and $v_L$ leads $v_{Lamp}$ by 90°. Thus, the average value of the product $v_{Lamp} v_L$ is zero. Therefore, a multiplier is used to obtain the product of $v_L$ and $v_{Lamp}$. Then, a first proportional integral (PI) 40 controller, labeled as PI-1 in the control method diagram part of FIG. 1, is used to integrate the product and give the phase-shift signal $\phi$ to a phase-locked loop (PLL) 42. The phase reference of the PLL 42 is taken from $v_{Lamp}$. The cut-off frequency of PI-1 40 is chosen to be lower than the operating frequency of the ballast 12. The output of PLL 42 will derive the gate signals to the transistor switches $S_A$ 34 and $S_B$ 36 in the ac/dc converter.

By considering the fundamental frequency component, based on (5), the reactive power q should be zero, $$K_1 |v_{Lamp}|^2 = K_2 |v_{Lamp}||v_o|\cos\phi \quad (7)$$

Based on the Fourier series, it can be shown that $$|v_o| = \frac{\sqrt{2}}{\pi} v_{dc} \tag{8}$$

By substituting $K_1$ and $K_2$ in (2), and (8) into (7), $$\cos\varphi = \frac{\pi\sqrt{2}}{2} \frac{|v_{Lamp}|}{v_{dc}} \frac{K_1}{K_2} \tag{9}$$

$$= \frac{\pi\sqrt{2}}{2} \frac{|v_{Lamp}|}{v_{dc}} (1 - \omega_s^2 L_r C_r)$$

By putting (9) into (6), the equivalent input resistance $R_{eq}$ of the ac/dc converter is $$R_{eq} = \frac{|v_{Lamp}|}{\sqrt{[K_2|v_o|]^2 - [K_1|v_{Lamp}|]^2}} \tag{10}$$

Thus, the values of $R_{eq}$ and $v_{Lamp}$ are controlled to follow the $R_{eq}$-$v_{Lamp}$ characteristics of the lamp by $v_o$.

By substituting (8) into (10), $$(K_2|v_o|)^2 = \left[\frac{|v_{Lamp}|}{R_{eq}(v_{Lamp})}\right]^2 + (K_1|v_{Lamp}|)^2 \tag{11}$$

$$v_{dc} = \frac{\sqrt{2}\,\pi \sqrt{\left[\frac{|v_{Lamp}|}{R_{eq}(v_{Lamp})}\right]^2 + (K_1|v_{Lamp}|)^2}}{2K_2}$$

Equation (11) gives the required magnitude of $v_{dc}$ that will make the equivalent input resistance of the ac/dc converter equal to $R_{eq}$.

$v_{dc}$ is regulated at the reference $v_{dc,ref}$ (FIG. 1) by the second-stage grid-connected VSI 18. If the power delivered to the power grid 20 is higher than the power drawn from the ballast 12, $v_{dc}$ will decrease, and vice versa. The regulation action is achieved by using a comparator 44 to compare $v_{Lamp}$ and $v_{Lamp,ref}$. A second PI controller 46, labeled as PI-2 in the control method diagram part of FIG. 1, is used to amplify and integrate the error to give $v_{dc,ref}$. If is larger than $v_{Lamp,ref}$, $v_{dc,ref}$ will decrease so as to regulate $v_{Lamp}$. Such a control loop is used to meet the requirement R2. The cut-off frequency of PI-2 46 is designed to be much lower than the switching frequency as it is used to control the gradual change of equivalent input resistance of the first stage for emulating the "thermionic low pressure arc" phase of the lamp that will be described below.

Second Stage 18—Power Grid-Connected Voltage Source Inverter (VSI).

For understanding the operation of the second stage 18, reference is again made to FIG. 1. As shown in FIG. 1, the power grid-connected VSI 18 is composed of a half-bridge circuit formed by $S_1$ 50 and $S_2$ 52 and a low-pass filter formed by inductors $L_s$ 54, $L_{ac}$ 56 and a capacitor $C_{ac}$ 58. The output current of the half-bridge $i_{Ls}$ is controlled to follow a current reference $i_{Ls,ref}$ by the hysteresis current control 60 (in the control block 14). $i_{Ls,ref}$ is in phase with the grid voltage $v_{ac}$. Thus, $$i_{Ls,ref} = K_i v_{ac} \tag{12}$$

where $K_i$ determines the magnitude of $i_{Ls,ref}$.

Figure 3:
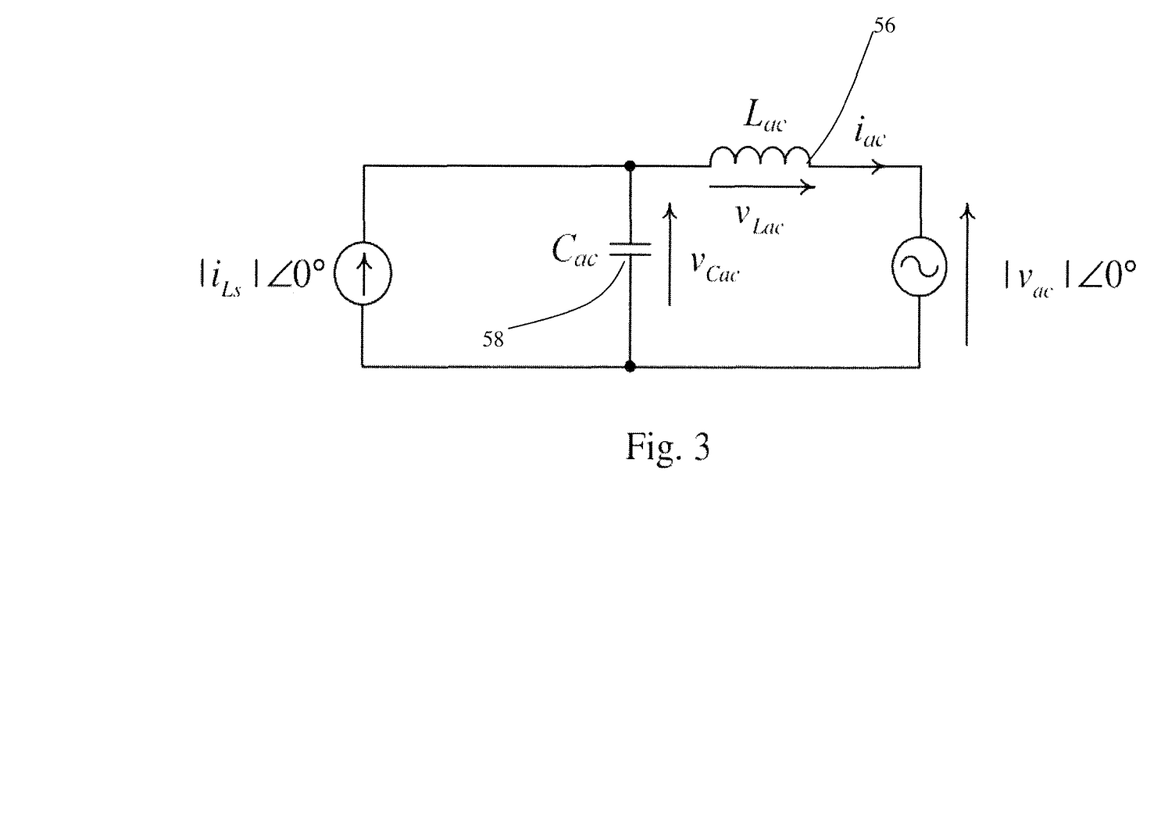
FIG. 3 is an equivalent circuit of the second stage of the burn-in apparatus of FIG. 1.

The value of $K_i$ is derived by using a third PI controller 62 in the control method diagram part of FIG. 1, labeled as PI-3, to amplify and integrate the error between $v_{dc,ref}$ and $v_{dc}$. If $V_{dc,ref}$ is larger than $v_{dc}$, $K_i$ will increase, and vice versa. The cutoff frequency of the PI-3 62 is lower than double the grid frequency. With this output current control, FIG. 3 shows an equivalent circuit of the VSI output circuit 18 to the power grid 20. It can be shown that $$|i_{ac}|\angle\delta = \frac{|i_{Ls}|\angle 0° \left|\frac{1}{\omega C_{ac}}\right|\angle -90° - |v_{ac}|\angle 0°}{|\omega L_{ac}|\angle 90° + \left|\frac{1}{\omega C_{ac}}\right|\angle -90°} \tag{13}$$

Assume at the conversion efficiency of the entire system is 100%.

$$p = |v_{ac}||i_{ac}|\cos\delta \tag{14}$$

where $|v_{ac}|$ is the magnitude of $v_{dc}$, $|i_{ac}|$ is the grid current and $\delta$ is the phase difference between $v_{ac}$ and $i_{ac}$.

Thus, by equating the real and imaginary parts of (13), $$|i_{Ls}| = \frac{p(1 - \omega^2 L_{ac} C_{ac})}{|v_{ac}|} \tag{15}$$

$$\delta = -\tan^{-1}\frac{\omega C_{ac}|v_{ac}|}{|i_{Ls}|} \tag{16}$$

As $C_{ac}$ 58 is used to filter the switching current ripple, $\omega C_{ac}|v_{ac}|$ is designed to have a much smaller value than $|i_{Ls}|$. $\delta$ is close to zero, giving a near unity power factor. $L_s$ 54 is designed to make the current ripple within a tolerance band and the operating frequency of the half-bridge within a frequency range.

With the burn-in apparatus 10 of the invention, it is possible to simulate different testing conditions for the ballast 12 under test. For example, it is possible to emulate the lamp start-up process. This process is described below.

Emulation of the Lamp Start-Up Process.

Figure 4A:
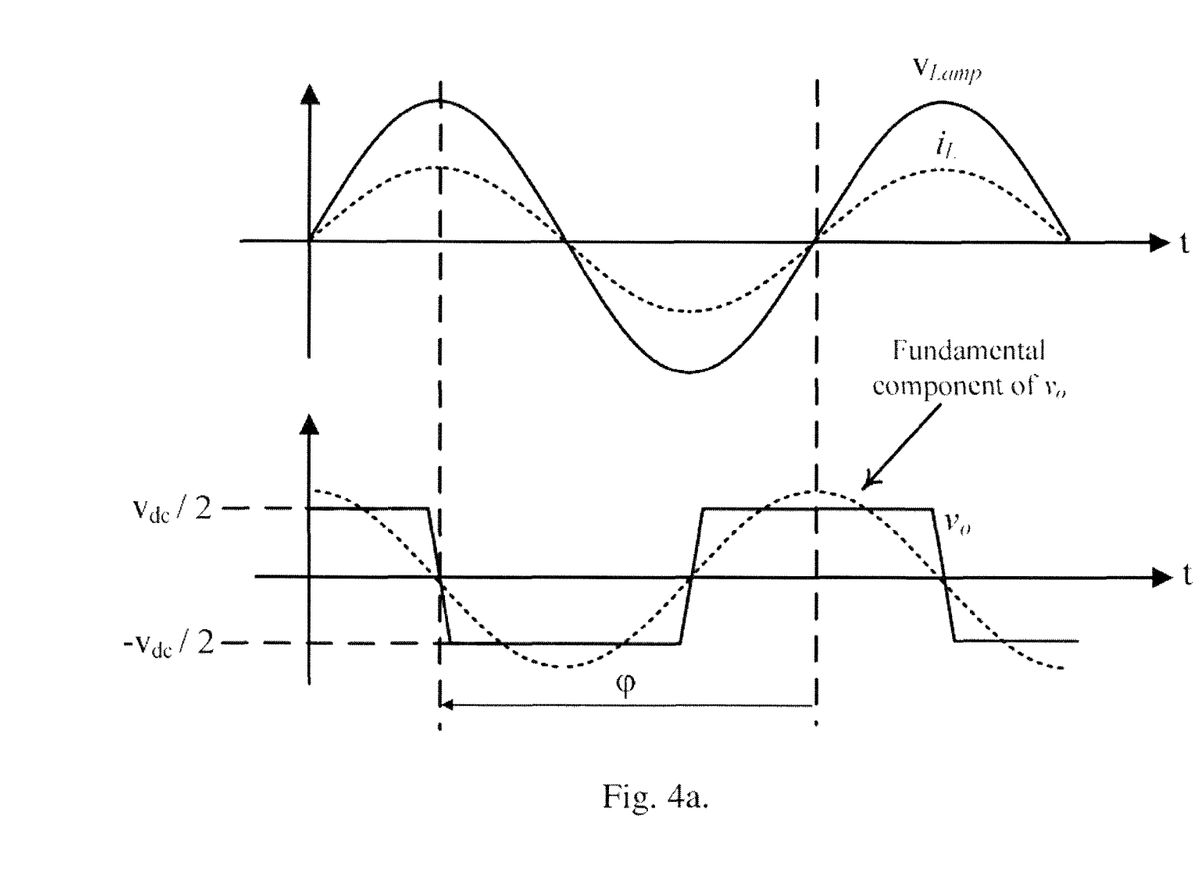
FIGS. 4a and b comprises key waveforms for the two stages of the energy-recyclable burn-in apparatus of FIG. 1 with FIG. 4a comprising key waveforms for the first stage of the burn-in apparatus and FIG. 4b comprising key waveforms for the second stage of the burn-in apparatus.

The starting process of a discharge lamp can be defined as a sequence of gas discharge phases. The first phase is "breakdown phase", during which the noble gas in the lamp tube converts from a nonconductive state to a conductive state by electrical breakdown. After this phase, it takes a much longer time to have the lamp cathode and tube fully heated up through a process termed the "thermionic low pressure arc" phase. Finally, the lamp gas reaches the steady-state operation pressure and temperature, and the ballast would reach its rated operation power. The burn-in apparatus 10 of the invention is controlled to emulate the above start-up process as follows:

1) Breakdown phase—as shown in FIG. 4, a relay 64 and a time delay circuit 66 are added at the input of the first-stage ac/dc converter 16. As a lamp before this phase is considered as an open circuit or $R_{eq} \to \infty$, the control circuit continuously senses the ballast output voltage and uses the time delay circuit 66, formed by a resistor $R_d$ 68 and a capacitor $C_d$ 70, to simulate the lamp "breakdown phase" period. The ballast output voltage (i.e., $v_{Lamp}$) is compared with the breakdown voltage $v_{BD}$ by a comparator 72 of the time delay circuit 66. If $v_{Lamp} > v_{BD}$, the relay will be triggered to close.

2) Thermionic low pressure arc phase—as the required value of $R_{eq}$ is small immediately after the breakdown phase, $v_{dc}$ and thus $v_o$ will be regulated at a higher voltage and the value of φ is adjusted by PI-1 30 to ensure a resistive input. The value of $v_{dc}$ is then reduced gradually by reducing $v_{dc,ref}$ in order to increase the value of $R_{eq}$. At the same time, $v_{Lamp}$ will rise gradually that simulates the heating up process of a real lamp.

3) Steady-state phase—$v_{Lamp}$ is regulated at the steady-state lamp voltage to simulate the steady-state operation of a lamp until the end of the burn-in test.

The invention therefore provides a method of burning-in an electronic ballast 12 using the novel apparatus 10 hereinbefore described, the method comprising the steps of: connecting the input of the first stage 16 of the burn-in apparatus 10 to the electronic ballast 12 to be burnt-in; connecting the output of the second stage 18 of the burn-in apparatus to the power supply 20; and operating the apparatus 10 for a predetermined period of time such that a voltage applied to the electronic ballast 12 simulates a steady-state operation of a lamp for the electronic ballast. However, prior to operating the apparatus 10 to emulate a steady-state operation of a lamp for the electronic ballast 12, the method preferably involves emulating a breakdown phase of the lamp for the electronic ballast 12 where the apparatus 10 is controlled to continuously monitor the output voltage of the ballast 12 and, at the comparator 72, compare the output voltage of the ballast 12 with a predetermined breakdown voltage and trigger the relay 64 when the output voltage of the ballast 12 exceeds the breakdown voltage. Furthermore, the method preferably includes, after emulation of the breakdown phase, operating the apparatus 10 to emulate a thermionic low pressure arc phase of the lamp for the electronic ballast whereby the apparatus 10 is controlled to modify a level of a reference voltage over time until the voltage of the electronic ballast 12 being burnt-in is determined as being at a level for emulating the steady-state operation of said lamp for the electronic ballast 12. The steps of the foregoing method can be automatically implemented by the processing unit 22 associated with the burn-in apparatus 10 of FIG. 1.

In designing the burn-in apparatus 10 of the invention, the values of the components of the ac/dc converter 16 and VSI 18 are designed separately. The design of the two stages 16, 18 of the burn-in apparatus 10 of FIG. 1 are explained in more detail below.

First Stage 16 of ac/dc Converter.

The values of the components of the first stage 16 comprising the ac/dc converter are designed by using the following parameters:

$f_s$: Switching frequency of the ballast 12
p: Steady-state lamp power
$v_{Lamp,min}$: Lamp voltage (i.e., ballast output voltage) after the breakdown phase
$R_{eq,min}$: Lamp resistance after the breakdown phase
$v_{o,min}$ Voltage on the ac side of the ac/dc converter after the breakdown phase Consider the simplified equivalent circuit shown in FIG. 2(a), the values of L 26, $L_r$ 28 and $C_r$ 30 are determined by the following steps.

Step 1—The resonant frequency of the output filter formed by $L_r$ 28 and $C_r$ 30 is chosen to be the same as the operating frequency of the ballast 12. That is, $$\frac{1}{\sqrt{L_r C_r}} = \omega_s = 2\pi f_s \quad (17)$$

By putting (17) into (9), $$\cos \phi = 0 \quad (18)$$

Based on (17), $1-\omega_s^2 L_r C_r = 0$. Thus, by substituting such condition into (2), $K_1 = 0$ and $$K_2 = -\frac{1}{\omega_s L_r}.$$

Thus, $$i_L = -\frac{v_o}{j\omega L_r} \quad (19)$$

As $i_L$ is in phase with $v_{Lamp}$, $v_o$ lags vLamp by 90°. Based on (18), $$\phi = 270° \quad (20)$$

By using (19), the equivalent input resistance of the converter is $$R_{eq} = \frac{|v_{Lamp}|}{|i_L|} = \omega L_r \frac{|v_{Lamp}|}{|v_o|} \quad (21)$$

During the thermionic low pressure arc phase, the lamp resistance changes from $R_{eq,min}$ at the beginning of this phase to $R_{eq,max}$ at the steady-state. Thus, $$R_{eq} \in [R_{eq,min}, R_{eq,max}] \quad (22)$$

Hence, based on (21), $v_{dc}$ and thus $v_o$ are varied within their maximum and minimum values to change the value of $R_{eq}$. That is, $$v_o \in [v_{o,min}, v_{o,max}] \quad (23)$$

and $$v_{dc} \in [v_{dc,min}, v_{dc,max}] = \left[\frac{\sqrt{2}\pi}{2} v_{o,min}, \frac{\sqrt{2}\pi}{2} v_{o,max}\right] \quad (24)$$

where $v_{o,min}$ and $v_{dc,min}$ are the values of $v_o$ and $v_{dc}$, respectively, when $R_{eq,min} = R_{eq}$, and $v_{o,max}$ and $v_{dc,max}$ are the values of $v_o$ and $v_{dc}$, respectively, when $R_{eq,max} = R_{eq}$.

The value of $L_r$ is designed by considering the operating condition at which the magnitudes of $v_{dc}$ and $v_o$ are the highest. This occurs when $R_{eq,min} = R_{eq}$, and $v_o = v_{o,min}$. $v_{o,min}$ is chosen to be slightly lower than the rated lamp voltage $v_{Lamp,max}$, which is the lamp voltage when $R_{eq,max} = R_{eq}$. Thus, based on (21), $$L_r = \frac{R_{eq,min}}{\omega_s} \frac{v_{o,min}}{|v_{Lamp,min}|} \quad (25)$$

By using (17), $$C_r = \frac{1}{\omega_s^2 L_r} \quad (26)$$

Step 2—The value of L 26 is designed by considering the condition that can ensure soft-switching of $S_A$ 34 and $S_B$ 36.

Such condition will be satisfied if $i_o$ leads $v_o$. Based on FIG. 2(a), by changing the phase reference with an angle φ, it can be shown that $$i_o = \frac{k_c|v_{lamp}|\angle-\varphi - |v_o|\angle 0°}{Z_{AB}+Z_C} \quad (27)$$
$$= \frac{k_c|v_{lamp}|\cos(-\varphi) - |v_o| + jk_c|v_{lamp}|\sin(-\varphi)}{Z_{AB}+Z_C}$$

where $$Z_{AB} = \frac{Z_A Z_B}{Z_A+Z_B} = \frac{j\omega_s L}{1-\omega_s^2 LC_r}$$

and $$k_c = \frac{Z_B}{Z_A+Z_B} = \frac{1}{1-\omega_s^2 LC_r}.$$

$i_o$ leads $v_o$ if the imaginary part of $i_o$, $\text{Im}[i_o]$, in (27) is positive. Thus, the soft-switching condition will be satisfied if $$\text{Im}[i_o] > 0 \Rightarrow \frac{k_c|v_{lamp}|\cos\varphi - |v_o|}{k_z + \omega_s L_r} < 0 \quad (28)$$

where $$k_z = \frac{\omega_s L}{1-\omega_s^2 LC_r}.$$

As cos φ=0, according to equation (28), the soft-switching criteria is $$1-\omega_s^2 LC_r > 0 \quad (29)$$
$$L < \frac{1}{\omega_s^2 C_r}$$

The value of L 26 should be chosen to be just close to the boundary value in (29) to ensure soft-switching, as further reducing the value of L 26 would lead to an increment of the current $i_o$ through $L_r$ 28, thus causing higher current stress on $L_r$ 28, and the switches $S_4$ 34 and $S_6$ 36. Hence, equations (25), (26) and (29) give the values for $L_r$ 28, $C_r$ 30, and L 26, respectively. It should be noted that the values of $L_r$ and $C_r$ are designed for a fixed operating frequency.

Second Stage 18 of the Grid-Connected Voltage Source Inverter.

The values of the components in the VSI 18 are designed by the following parameters:

cos δ: Output power factor of the VSI 18, typically higher than 0.98
$\Delta i_{Ls}$: Current ripple through the inductor $L_s$ 54
$f_{s2,avg}$: Average switching frequency of the VSI 18
$v_{dc}$: dc link voltage at the rated condition
$\Delta v_{dc}$: Maximum allowable voltage ripple in $v_{dc}$
$|v_{ac}|$: rms value of the grid voltage
p: Steady-state lamp power f: Grid frequency
k: Ratio between the impedances of $L_{ac}$ 56 and $C_{ac}$ 58

Based on the equivalent circuit in FIG. 3, the values of $L_s$ 54, $C_{ac}$ 58, and $L_{ac}$ 56 are determined by the following steps.

Step 1—Choose the width of hysteresis band $\Delta i_{Ls}$ for the current flowing through $L_s$ 54, for example, 5% of reference current $|i_{Ls,ref}|$. Assume that the variation of $v_{ac}$ is negligible in one switching cycle. Without loss of generality, consider the inverter output current at $t_x$ in FIG. 4(b) with $v_{ac}$ in the positive half cycle. When $S_1$ 50 is on and $S_2$ 52 is off, the input voltage $v_{inv}$ of the LCL-filter is $v_{dc}/2$ and the current through $L_s$ 54 will increase. Thus, the rise time of the current $i_{Ls}$, $t_r$, is equal to $$t_r = \frac{L_s \Delta i_{Ls}}{v_{dc}/2 - v_{ac}(t_x)} \quad (30)$$

Figure 4B:
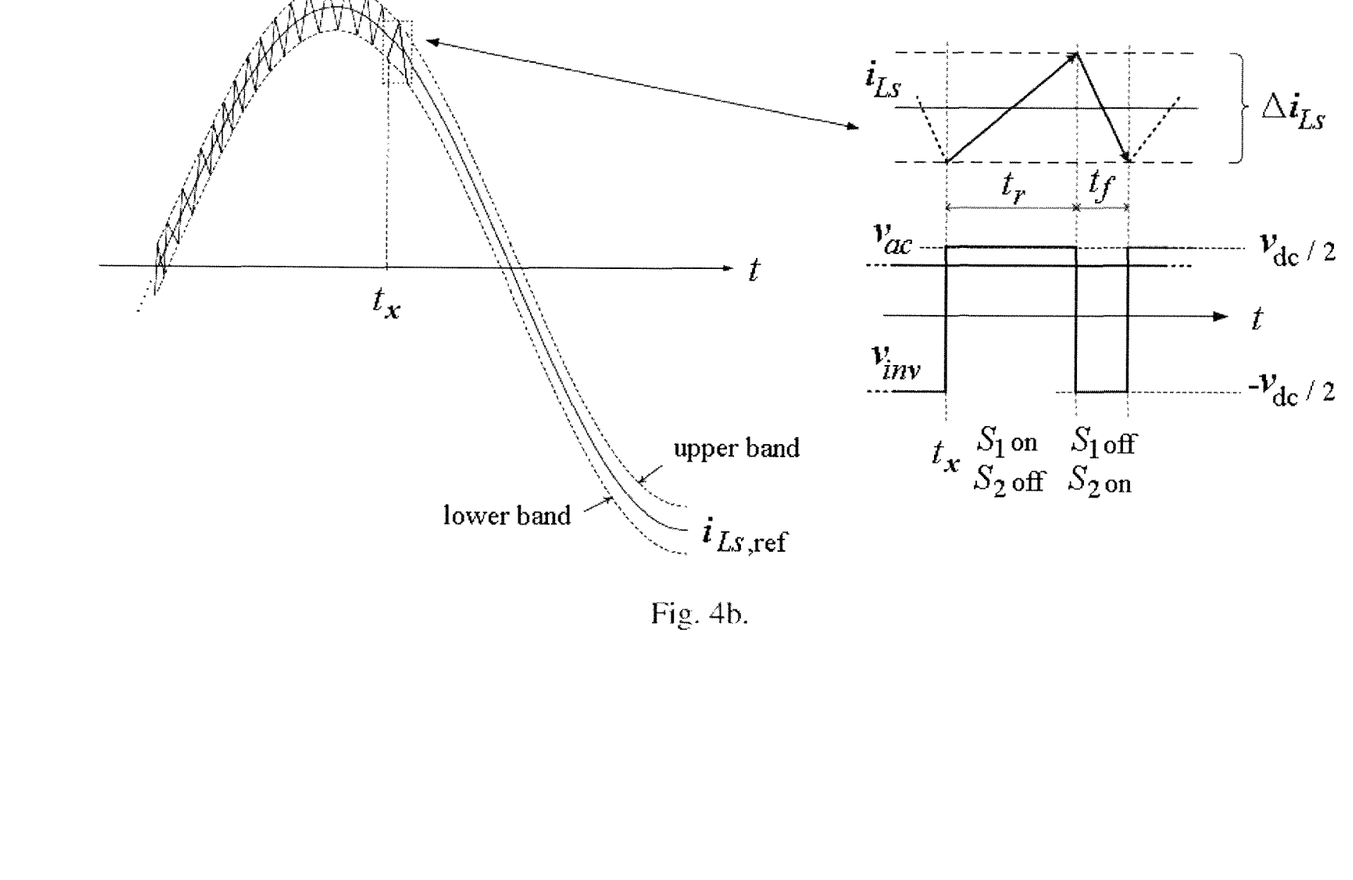

Then, when $S_1$ 50 is off and $S_2$ 52 is on, $v_{inv}=-v_{dc}/2$ and the current through $L_s$ 54 will decrease. Thus, the fall time of the current $i_{Ls}$, $t_f$, is equal to $$t_f = \frac{L_s \Delta i_{Ls}}{v_{dc}/2 + v_{ac}(t_x)} \quad (31)$$

Thus the instantaneous switching frequency $f_{s2}$ of the inverter 18 is $$f_{s2} = \frac{1}{t_r+t_f} = \frac{[v_{dc}^2/4 - v_{ac}^2(t_x)]}{L_s \Delta i_{Ls} v_{dc}} = \frac{1}{L_s \Delta i_{Ls}}\left[\frac{v_{dc}^2}{4} - \frac{v_{ac}^2(t_x)}{v_{dc}}\right] \quad (32)$$

Thus, $f_{s2}$ is minimum when $v_{ac}=\sqrt{2}|v_{ac}|$, and maximum when $v_{ac}=0$. Thus, it can be shown that the minimum frequency $f_{s2,min}$ and maximum frequency $f_{s2,max}$ are $$f_{s2,min} = \frac{1}{L_s \Delta i_{Ls}}\left(\frac{v_{dc}}{4} - 2\frac{|v_{ac}|^2}{v_{dc}}\right) \quad (33)$$

and $$f_{s2,max} = \frac{1}{4L_s \Delta i_{Ls}} v_{dc} \quad (34)$$

The average switching frequency $f_{s2,avg}$ $$f_{s2,avg} = \frac{f_{s2,max}+f_{s2,min}}{2} = \frac{1}{L_s \Delta i_{Ls}}\left(\frac{v_{dc}}{4} - \frac{|v_{ac}|^2}{v_{dc}}\right) \quad (35)$$

The value of $L_s$ 54 is designed to be $$L_s = \frac{1}{\Delta i_{Ls} f_{s2,avg}} \frac{v_{dc}^2 - 4|v_{ac}|^2}{4v_{dc}} \quad (36)$$

Step 2—Based on (16), the output power factor of the VSI 8 is $$\cos\delta = \frac{|i_{Ls}|}{\sqrt{|i_{Ls}|^2 + (\omega C_{ac}|v_{ac}|)^2}} \quad (37)$$

Thus, by substituting (15) into (37), $$\cos\delta = \frac{1 - \omega^2 L_{ac} C_{ac}}{\sqrt{(1 - \omega^2 L_{ac} C_{ac})^2 + \left(\omega C_{ac} \frac{|v_{ac}|^2}{p}\right)^2}} \quad (38)$$

In order to minimize the current ripple getting into the power grid, the value of $L_{ac}$ 56 is chosen to have a reactance of k times larger than the impedance of $C_{ac}$ 58 at the average switching frequency. Thus, $$L_{ac} C_{ac} = \frac{k}{\omega_{s2,avg}^2} \quad (39)$$

where $\omega_{s2,avg} = 2\pi f_{s2,avg}$.

The values of $C_{ac}$ 58 and $L_{ac}$ 56 are determined by solving (38) and (39) that $$C_{ac} = \frac{p|\tan\delta|(1 - k|\omega/\omega_{s2,avg}|^2)}{\omega|v_{ac}|^2} \quad (40)$$

$$L_{ac} = \frac{k}{\omega_{s2,avg}^2 C_{ac}} \quad (41)$$

Step 3—As the power drawn to the grid is at double of the grid frequency and the power supplying from the ballast is relatively constant, the capacitor voltage consists of a ripple voltage of $\Delta v_{dc}$ varying at double that of the grid frequency. The value of the two series connected dc link capacitors $C_{dc}$ in FIG. 1 is then determined by the maximum allowable value of $\Delta v_{dc}$. The energy stored in the capacitor is $$E_C = \frac{1}{2} \frac{C_{dc}}{2} v_{dc}^2 \quad (42)$$

By differentiating (42), $$\Delta E_C = \tfrac{1}{2} C_{dc} v_{dc} \Delta v_{dc} \quad (43)$$

By considering the energy flow from the ballast to the grid, the steady-state variation of the energy stored in $C_{dc}$ 32, $\Delta E_C$ is equal to $$\Delta E_C = \frac{p}{\omega} \quad (44)$$

Then, by equating (43) and (44), $$C_{dc} = \frac{2p}{\omega v_{dc} \Delta v_{dc}} \quad (45)$$

The values of p and $v_{dc}$ their corresponding rated values. Hence, equations (36), (40), (41) and (45) give the values for $L_s$ 54, $L_{ac}$ 56, $C_{ac}$ 58 and $C_{dc}$ 32, respectively.

Step 4—The turns ratio n of the output transformer 74 in FIG. 1 is determined by considering the ratio between the voltage of the power grid $v_{grid}$ and the voltage of the dc link $v_{dc}$ in FIG. 1. Since the amplitude of $v_{ac}$ has to be lower than half of $v_{dc}$ to ensure proper operation of the VSI. The value of n is chosen as $$n = \frac{2\sqrt{2} |v_{grid}|}{v_{dc}} \quad (46)$$

where $|v_{grid}|$ is the rms value of $v_{grid}$.

As the second stage 18 of the burn-in apparatus is a typical grid-connected inverter, there are many already known control methods for controlling power being recycled to the power grid 20.

To verify operation of the novel burn-in apparatus 10 of the invention, an evaluation of a prototype apparatus burning in an electronic ballast 12 was conducted on a 400 W high-pressure sodium (HPS) lamp ballast: LEO HPS Electronic ballast, Model: AIE-NG400DGU-PLUS. The prototype burn-in apparatus 10 was constructed as hereinbefore described and the design specifications for said apparatus are given in Table II of the drawings. Based on the design procedure given above, the values of the components of the circuit shown in FIG. 1 are given in Table I of the drawings. The performance of the burn-in apparatus 10 was compared with a HPS lamp connected to the same electronic ballast 12.

The comparison of the burn-in apparatus 10 with a HPS lamp demonstrated that the burn-in apparatus 10 behaves to the ballast 12 just as the lamp does during the various stages of the lamp start-up and steady state operations. It was found that the measured power from the ballast 12 is 359 W and the measured power returned to the power grid 20 is 324 W. Thus, the efficiency of the entire burn-in apparatus 10 is 90.3%. Hence, the prototype burn-in apparatus 10 can save up 0.324 kWh electricity each hour. For a twelve hour operation, the burn-in apparatus 10 can reduce carbon emissions by 0.32× 12×0.47 kg/kWh=1.8 kg $CO_2$. Moreover, it can reduce power consumption of associated ventilation systems at the burn-in test facility.

Figure 5:
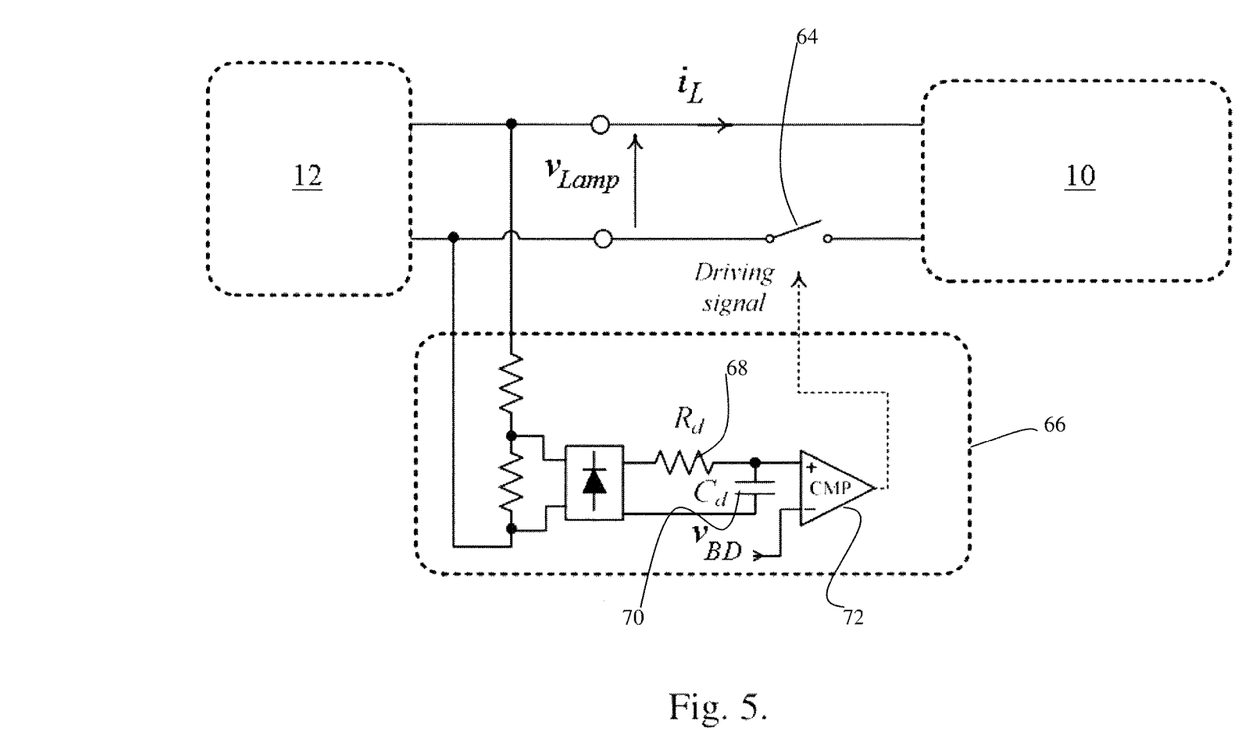
FIG. 5 comprises a relay and time delay turn-on circuit for modifying the apparatus of FIG. 1 to simulating the breakdown phase of a lamp used with an electronic ballast.

The relay 64 of FIG. 5 is used to emulate the breakdown phase of the lamp. In the verification results, the peak ignition voltage generated by the ballast 12 was less than 2 kV. The rating of the relay 64 used in the prototype apparatus 10 was 3.5 kV which is high enough to withstand the ignition voltage. However, in a situation requiring a higher voltage, a switching device, such as a spark gap device, might best be used in place of the relay 64.

An energy-recyclable burn-in technology for electronic ballasts has been presented. The burn-in device simulates the resistive characteristics of a HPS lamp operating at high frequency, processes high-frequency ballast output power, and recycles the power back into the grid. The burn-in apparatus also enables a method to simulate the start-up process of the HPS lamp. The novel burn-in apparatus of the invention can handle high-frequency ac power and can emulate different operating conditions, including startup period, ignition period and steady-state operation of a lamp.

In general, the invention provides an apparatus and a method for burning-in an electronic ballast for a lamp. The apparatus comprises a first stage for emulating an input impedance characteristic of a lamp for the electronic ballast and a second stage connected to the first stage for providing energy feedback to a power supply. An input of the first stage connects in use to the electronic ballast to be burnt-in. An output of the second stage connects in use to the power supply to provide energy feedback to said power supply from the electronic ballast being burnt-in. The energy-recyclable burn-in apparatus can emulate the lamp characteristics from start up to the steady state, process high-frequency ballast output power and recycle the power back into the power grid. The burn-in method includes operating the apparatus for a predetermined period of time such that a voltage applied to the electronic ballast simulates a steady-state operation of a lamp for the electronic ballast.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. An apparatus for burning-in an electronic ballast, comprising:
    a first stage for emulating an input impedance characteristic of a lamp for the electronic ballast;
    a second stage connected to the first stage for providing energy feedback to a power supply;
    an input of the first stage for connecting to the electronic ballast to be burnt-in; and
    an output of the second stage for connecting to the power supply to provide energy feedback to said power supply from the electronic ballast being burnt-in, wherein the first stage comprises a high frequency ac/dc converter to emulate the input impedance characteristic of the lamp for the electronic ballast, wherein the input of the high frequency ac/dc converter is connectable to an output of the electronic ballast to be burnt-in by a circuit comprising an inductor and an LC filter, and wherein gate signals for first and second transistors of the high frequency ac/dc converter are switched at the same or nearly at the same frequency as the operating frequency of the electronic ballast to be burnt-in.

2. The apparatus of claim 1, wherein the high frequency ac/dc converter is operable to convert a high frequency ac power signal from the electronic ballast to a dc power signal.

3. The apparatus of claim 1, wherein the LC filter is adapted to be operated at a resonant frequency equal to or near to the operating frequency of the electronic ballast to be burnt-in.

4. A method of burning-in an electronic ballast using an apparatus comprising: a first stage for emulating an input impedance characteristic of a lamp for the electronic ballast; a second stage connected to the first stage for providing energy feedback to a power supply; an input of the first stage for connecting to the electronic ballast to be burnt-in; and an output of the second stage for connecting to the power supply to provide energy feedback to said power supply from the electronic ballast being burnt-in; the method comprising the steps of:
    connecting the input of the first stage to the electronic ballast to be burnt-in;
    connecting the output of the second stage to the power supply; and
    operating the apparatus for a predetermined period of time such that a voltage applied to the electronic ballast simulates a steady-state operation of a lamp for the electronic ballast, wherein the method further comprises, prior to operating the apparatus to emulate a steady-state operation of a lamp for the electronic ballast, the step of emulating a breakdown phase of the lamp for the electronic ballast whereby a relay and comparator circuit is connected at the input of the first stage and the apparatus is controlled to:
    continuously monitor the output voltage of the ballast;
    at the comparator, compare the output voltage of the ballast with a predetermined breakdown voltage; and
    trigger the relay when the output voltage of the ballast exceeds the breakdown voltage.

5. The method of claim 4, wherein the method comprises, after operating the apparatus to emulate a breakdown phase, the step of emulating a thermionic low pressure arc phase of the lamp for the electronic ballast whereby the apparatus is controlled to:
    modify a level of a reference voltage over time until the voltage of the electronic ballast being burnt-in is determined as being at a level for emulating the steady-state operation of said lamp for the electronic ballast.

* * * * *